United States Patent [19]

Wakabayashi et al.

[11] Patent Number: 4,642,716
[45] Date of Patent: Feb. 10, 1987

[54] MAGNETIC TRANSDUCER HEAD ASSEMBLY WITH SUPPORT SYSTEM THEREFOR

[75] Inventors: Noboru Wakabayashi, Tagajo; Katsuhiko Akiyama, Atsugi; Yutaka Soda, Ebina; Hiroyuki Uchida, Atsugi, all of Japan

[73] Assignee: Sony Corporation, Tokyo, Japan

[21] Appl. No.: 544,995

[22] Filed: Oct. 24, 1983

[30] Foreign Application Priority Data

Oct. 28, 1982 [JP] Japan ................. 57-189860

[51] Int. Cl.⁴ ................. G11B 5/48; G11B 21/16; G11B 5/127; G11B 5/17
[52] U.S. Cl. ................. 360/104; 360/113; 360/125; 360/123; 174/52 PE; 428/416; 357/81
[58] Field of Search ............. 174/52 PE; 264/272.14, 264/272.13, 272.17; 29/603; 360/113, 125, 102, 103, 104, 108; 361/386, 395; 357/27; 428/416, 418, 694

[56] References Cited

U.S. PATENT DOCUMENTS

| | | | |
|---|---|---|---|
| Re. 29,683 | 6/1978 | Ocken, Jr. ............. | 361/386 |
| 3,747,201 | 7/1973 | Arai ............. | 357/27 |
| 3,930,114 | 12/1975 | Hodge ............. | 264/272.17 |
| 3,975,771 | 8/1976 | Lazzari ............. | 360/125 |
| 4,030,189 | 6/1977 | Lazzari ............. | 360/122 |
| 4,209,813 | 6/1980 | Bryer ............. | 360/105 |
| 4,218,701 | 8/1980 | Shirasaki ............. | 174/52 PE |
| 4,229,248 | 10/1980 | Silverman et al. ............. | 357/27 |
| 4,250,347 | 2/1981 | Fierkens ............. | 264/272.17 |
| 4,379,316 | 4/1983 | Krane ............. | 360/105 |
| 4,396,936 | 8/1983 | McIver et al. ............. | 174/52 PE |
| 4,402,025 | 8/1983 | Anderson et al. ............. | 360/103 |
| 4,429,337 | 1/1984 | de Wilde ............. | 360/125 |
| 4,435,900 | 3/1984 | de Wilde ............. | 360/123 |
| 4,483,067 | 11/1984 | Parmentier ............. | 174/52 PE |
| 4,523,243 | 6/1985 | Billington ............. | 360/113 |

FOREIGN PATENT DOCUMENTS

| | | | |
|---|---|---|---|
| 52-69606 | 9/1977 | Japan ............. | 360/108 |
| 53-69623 | 6/1978 | Japan ............. | 360/103 |
| 54-49113 | 4/1979 | Japan ............. | 360/125 |
| 56-159864 | 12/1981 | Japan ............. | 360/104 |
| 59-67669(A) | 4/1984 | Japan ............. | 357/27 |
| 59-168968 | 9/1984 | Japan ............. | 360/104 |
| 2064200 | 6/1981 | United Kingdom ............. | 360/104 |

OTHER PUBLICATIONS

*IBM Technical Disclosure Bulletin*, vol. 23, No. 12, May 1981, pp. 5556–5557, "Magnetic Head Arm Assembly", by W. L. Wright.
*IBM Technical Disclosure Bulletin*, vol. 12, No. 12, May 1970, p. 2167, "Integrated Read Pre-ampl. and Crash Detector for Disk File", by Collins.

*Primary Examiner*—John H. Wolff
*Assistant Examiner*—Alfonso Garcia
*Attorney, Agent, or Firm*—Hill, Van Santen, Steadman & Simpson

[57] ABSTRACT

A magnetic transducer head assembly having a support member in which a magnetic transducer head mounting portion, an integrated circuit element mounting portion and a plurality of lead terminals are supported to be a unitary body by a resin mold, a multichannel magnetic transducer head element mounted on the magnetic transducer head mounting portion, an integrated circuit element mounted on the integrated circuit element mounting portion which integrated circuit element includes a reproducing or recording circuit for the magnetic transducer head element, and wiring for carrying out a predetermined electric connection between the integrated circuit element and the lead terminals.

7 Claims, 7 Drawing Figures

MAGNETIC TRANSDUCER HEAD ASSEMBLY WITH SUPPORT SYSTEM THEREFOR

BACKGROUND OF THE INVENTION

1. Field of the Invention

The present invention generally relates to a magnetic transducer head assembly and more particularly to a magnetic transducer head assembly which has a multichannel magnetic transducer head element useful for the recording and/or reproducing of, for example, a pulse code modulated (PCM) audio signal.

2. Description of the Prior Art

A multichannel, for example, 16-channel magnetic transducer head element for recording and reproducing a PCM signal has been proposed as shown in FIGS. 1 and 2 which are an enlarged cross-sectional view and a plan view thereof. This previously proposed multichannel magnetic transducer head element 1 uses a rectangular shape magnetic substrate 2 made of, for example, magnetic ferrite. On the magnetic substrate 2 is formed a groove 3 along its londitudinal direction (the vertical direction in FIG. 2) into which non-magnetic material 4, for example, glass is filled. Also, on this magnetic base 2 is deposited a nonmagnetic insulating layer 5 made of, for example, SiO$_2$. Further, on this magnetic base 2 is deposited a conductor means 6. The conductor means 6 comprises a band shape conductive layer 7 which makes a common bias coil for each channel of, for example, 16 channels and a band shape conductive layer 8 which makes a signal coil provided corresponding to each channel. Across the conductor means 6 are deposited thin film magnetic layers 9 corresponding to respective channels of, for example, 16 channels. Under this thin film magnetic layer 9 is deposited a non-magnetic insulating layer 10, made of, for example, an SiO$_2$ layer which makes a gap spacer together with the insulating layer 5 to cover the conductor means 6 and interpose between it and the magnetic substrate 2. The thin film magnetic layer 9 of each channel is extended and arranged in parallel so as to transverse the band shape conductive layer 7 which becomes the common bias coil and the band shape conductive layer 8 which becomes the signal coil of each channel and to face at its end edge to the front edge 2a of the magnetic substrate 2. The both end portions of the band shape conductive layer 7 and those of each of the band shape conductive layers 8 are extended to the rear edge 2b of the magnetic substrate 2 or in the proximity thereof as lead terminals 7a, 7b and 8a, 8b for the external circuit, respectively. Then, covering all of the thin film magnetic layers 9, a protecting base 11 having superior wear proof, for example, glass base is bonded by adhesive agent 12 to the portions of the above lead terminals 7a, 7b and 8a, 8b except their extended portions.

To the terminals 7a, 7b and 8a, 8b of the conductor means 6 in the multichannel magnetic transducer head element 1 thus constructed are connected corresponding lead wires 14 on a common flexible wiring board 13. The above connection is carried out by soldering. For example, each lead wire 14 is provided at its end portion with a solder and through the solder, the end portions of the lead wires 14 are superposed upon the corresponding lead terminals 7a, 7b and 8a, 8b. Under this superposed state, the portions in which they are superposed upon one other as mentioned above are heated to melt the solders and thus each portion is connected together. Through this flexible wiring board 13, the multichannel magnetic transducer head element 1 is connected to an output (recording) circuit (not shown) or an input (reproducing) circuit (not shown, too).

With such construction, the magnetic thin films 9 and the magnetic substrate 2 constitute closed magnetic circuits. At the front edge 2a of the magnetic base 2 is formed each operation magnetic gap g having a gap length which is restricted by the thicknesses of the non-magnetic insulating layers 5 and 10 interposed between the magnetic substrate 2 and the magnetic thin film 9. The magnetic transducer head element for each channel in which each closed magnetic circuit passes through the conductive layers 7 and 8 is arranged in the vertical direction. With this construction, the PCM signals can be recorded into 16 channels simultaneously and the recorded PCM signals can be reproduced from 16 channels simultaneously, too.

However, such multichannel magnetic transducer head element 1 includes a great number of terminals. By way of example, when the number of channels is 16, there are required 34 terminals in total which consists of 2 bias coil terminals 7a, 7b and 32 terminals 8a and 8b for the signal coil 8. In the prior art, the recording circuit which includes a serial-to-parallel converter or the like for supplying a recording signal to this multichannel magnetic transducer head element 1 or the reproducing circuit which includes a parallel-to-serial converter or the like for delivering the reproduced signal from this multichannel magnetic transducer head element 1 is formed separately from the multichannel magnetic transducer head element 1. In consequence, the multichannel magnetic transducer head 1 is connected to the recording circuit or the reproducing circuit through the flexible wiring board 13 or the like as shown in FIGS. 1 and 2. There is then a defect that so many connection wires are required. Moreover, such so many connection wires cause the manufacturing, adjusting and so on of the magnetic transducer head when assembled into the tape recorder to be quite difficult and the moving of the flexible wiring board 13 causes a noise to be increased too much.

OBJECTS AND SUMMARY OF THE INVENTION

Accordingly, it is an object of the present invention to provide an improved magnetic transducer head.

It is another object of the present invention to provide a magnetic transducer head having a multichannel magnetic transducer head element of which the number of lead wires can be reduced greatly.

It is a further object of the present invention to provide a magnetic transducer head which can be manufactured relatively easily.

It is a still further object of the present invention to provide a magnetic transducer head which can reduce a noise caused by lead wires.

According to one aspect of the present invention, there is provided a magnetic transducer head assembly comprising:

a support member in which a magnetic transducer head mounting portion, an integrated circuit element mounting portion and a plurality of lead terminals are supported to be a unitary body by a resin mold;

a multichannel magnetic transducer head element mounted on said magnetic transducer head mounting portion; an integrated circuit element mounted on said integrated circuit element mounting portion, said integrated circuit element having a reproducing or recording circuit for said magnetic transducer head element; and wiring means for carrying out a predetermined electrical connection between said integrated circuit element and said lead terminals.

The other objects, features and advantages of the present invention will become apparent from the following description taken in conjunction with the accompanying drawings through which the like references designate the same elements and parts.

DESCRIPTION OF THE PREFERRED EMBODIMENTS

Now, an embodiment of the magnetic transducer head assembly according to the present invention will hereinafter be described with reference to FIGS. 3 to 6, in accordance with the manufacturing process thereof. Throughout FIGS. 3 to 6, like parts corresponding to those of FIGS. 1 and 2 are marked with the same references and the detailed explanation therefor will not be made.

Figure 3:
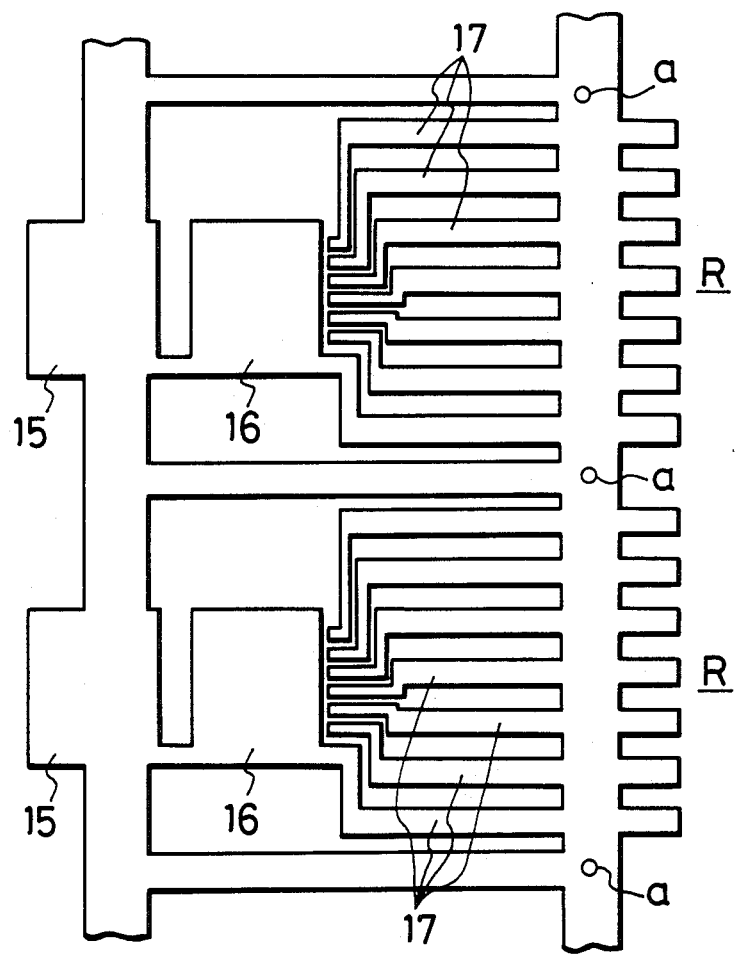
FIGS. 3 and 4 are respectively partially cut-out plan views illustrating the manufacturing process of an embodiment of a magnetic transducer head according to the present invention.
Figure 4:
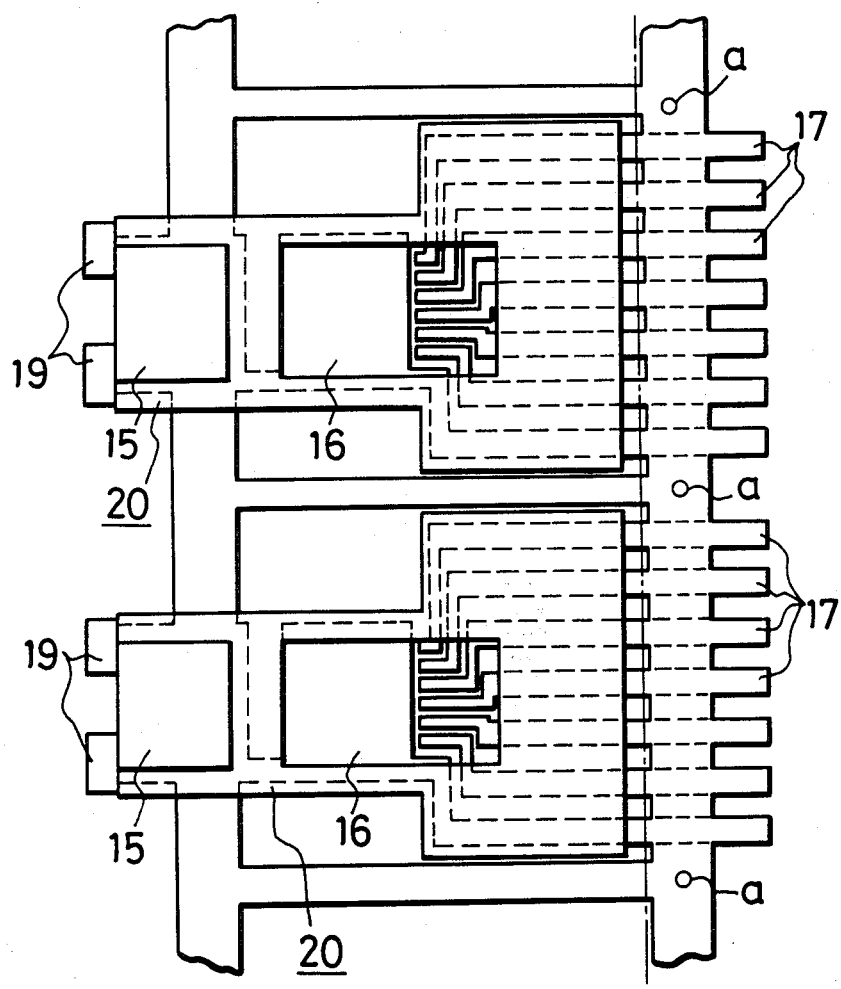

In this embodiment, first, as shown in FIG. 3, a plurality of lead frames R, each having a magnetic head mounting portion 15, an integrated circuit element mounting portion 16 and eight lead wires 17, are formed to be predetermined shapes by press or etching process. The reason why a plurality of lead frames R are formed is that it is convenient for mass-production. As the material of the lead frame R, there can be used a thin plate made of Kovar alloy (alloy composed mainly of Fe and Ni and containing a little amount of Co) and Cu-system alloy. In FIGS. 3 and 4, reference letters a designate positioning through-holes used upon manufacturing the lead frame R.

A metal plate made of Cu, Al and so on in which a heat radiating plate 18 and a tape guide 19 are integrally formed is subjected to the transfer mold or injection mold process in a mold so as to have a predetermined positional relation relative to the lead frame R and thereby a support member 20 as shown in FIG. 4 is formed. In this case, the support member 20 is made unitary with the magnetic head mounting portion 15, the integrated circuit element mounting portion 16 and the lead wires 17 by means of mold resin 21. Further, the mold resin 21 is used to form predetermined walls in the magnetic head mounting portion 15 and the integrated circuit element mounting portion 16 by which the mounting positions of the multichannel magnetic transducer head element 1 and an integrated circuit element 22, which will be described later, are restricted. In this case, the mounting position of the multichannel magnetic transducer head element 1 is determined in view of the projecting amount, the upper and/or lower position and the elevation angle of the head element 1. Also, in this case, it is possible that a screw bore for mounting the magnetic head assembly is formed through the heat radiating plate 18.

Figure 1:
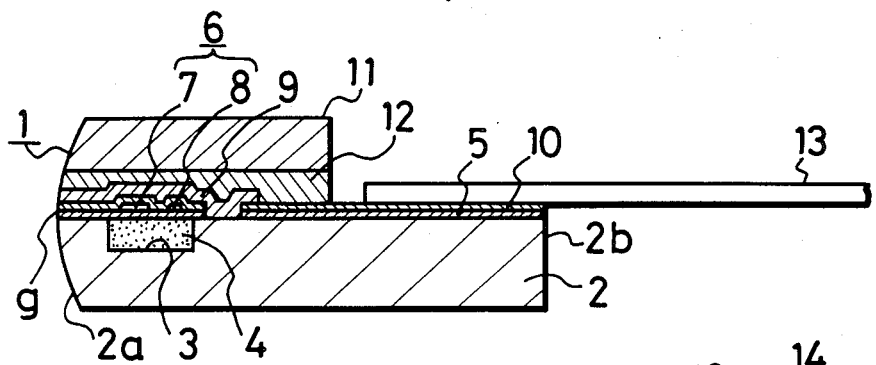
FIGS. 1 and 2 are an enlarged cross-sectional view and an enlarged plan view of a conventional multichannel magnetic transducer head element, respectively.
Figure 2:
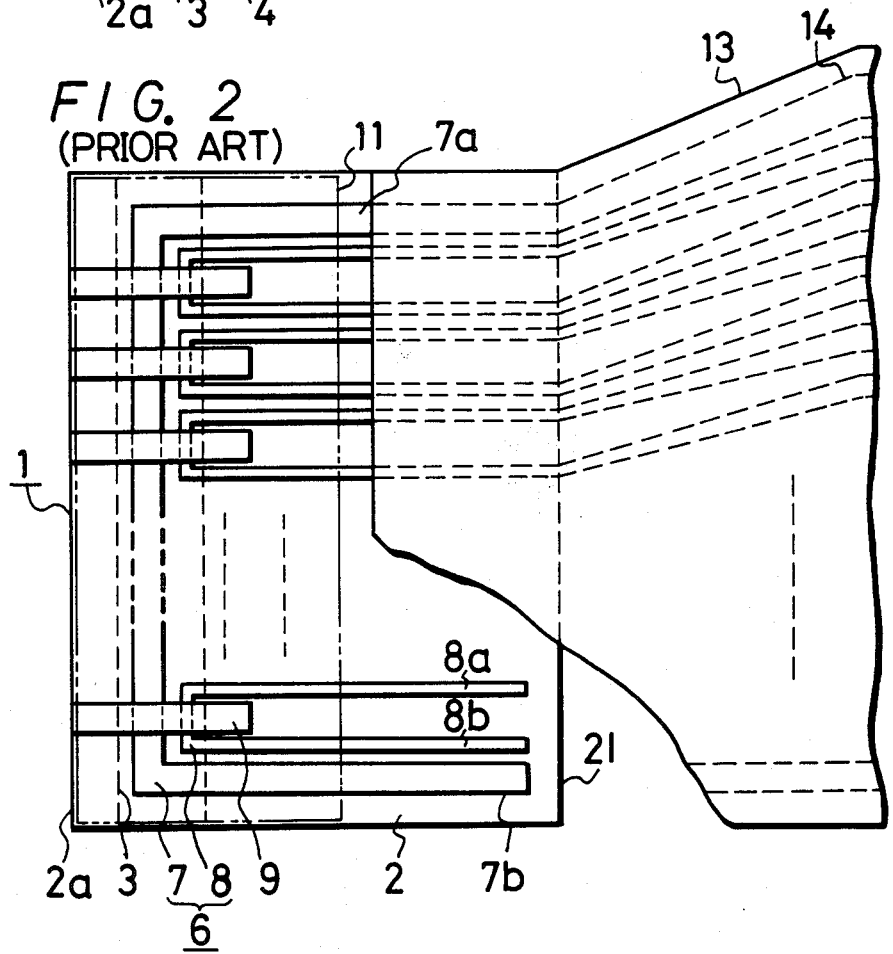
Figure 5:
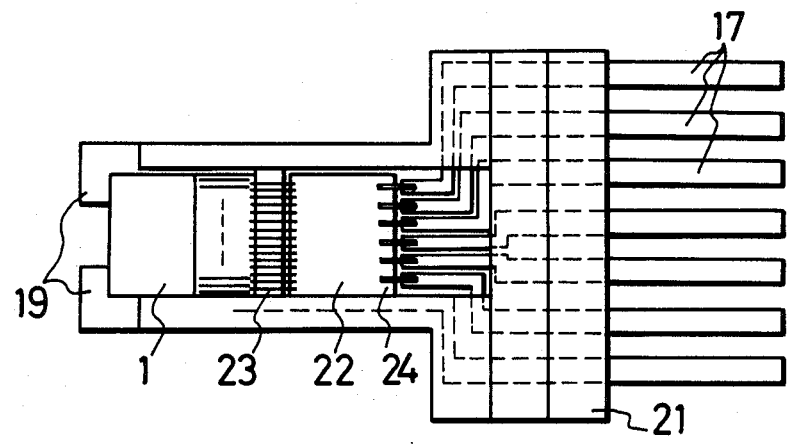
FIGS. 5 and 6 are respectively an enlarged plan view and an enlarged cross-sectional view illustrating an embodiment of the magnetic transducer head according to the present invention.
Figure 6:
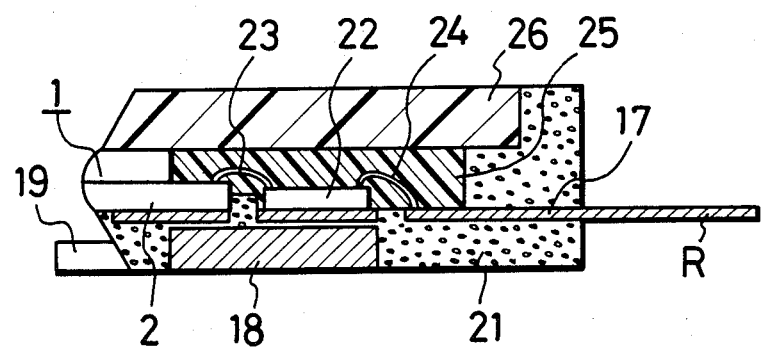

As shown in FIGS. 5 and 6, the magnetic substrate 2 side of the multichannel magnetic transducer head element 1 such as shown in FIGS. 1 and 2 is bonded to the magnetic head mounting portion 15. This bonding is carried out by the use of heat-conductive and electric-conductive epoxy resin containing metal powders or solder having a low melting point. In this case, the multichannel magnetic transducer head element 1 is bonded to the magnetic head mounting portion 15 along the position restricting wall formed by the mold resin 21. As a result, the position restriction of the multichannel magnetic transducer head element 1 becomes quite easy. Moreover, the ground side of the integrated circuit element 22 is bonded to the integrated circuit element mounting portion 16 by the use of heat-conductive and electric-conductive epoxy resin containing metal powders or solder having a low melting point. The integrated circuit element 22 includes a recording circuit for the signal to the multichannel magnetic transducer head element 1 or a reproducing circuit for the signal from the multichannel magnetic transducer head element 1. As the recording circuit, there may be considered a serial/parallel converter circuit and a record driving circuit. On the other hand, as the reproducing circuit, there may be considered a playback amplifier and a parallel/serial converter circuit. Moreover, it may be possible that this integrated circuit element 22 includes an A/D (analog-to-digital) converter circuit or D/A (digital-to-analog) converter circuit and so on. In addition, when a magneto-resistance effect element is used as the playback head, the output from the playback head is supplied to the integrated circuit through a condenser array which has the capacitors the number of which corresponds to the number of the channels. In this case, at any rate, the signal corresponding to the number of the channels is transmitted between the integrated circuit element 22 and the multichannel magnetic transducer head element 1. The number of the lead wires 17 led out from the magnetic head assembly has to be the number corresponding to the number of the power source line for driving the integrated circuit and clock lines, however, in this case, one signal transmission line is sufficient.

Then, the terminals 7a, 7b and 8a, 8b of the multichannel magnetic transducer head 1 are connected to the predetermined terminals of the integrated circuit element 22 by Au thermosonic wire bonding or by soldering the beam lead provided on the integrated circuit element 22 to provide a wiring 23. Further, the predetermined terminals of the integrated circuit element 22 are connected to the predetermined lead wires 17 by Au thermosonic wire bonding or by soldering the beam lead provided on the integrated circuit element 22 to provide a wiring 24.

Then, on the predetermined position of the multichannel magnetic transducer head element 1, on the integrated circuit element 22 and on the predetermined position of the lead wires 17 is filled sealant epoxy resin 25, and a mold cover 26 is fixedly bonded by this epoxy resin 25.

Subsequently, the lead frame R is cut out along the line shown by broken lines or one-dot chain line in FIG.

4 and thereby the magnetic head assembly shown in FIGS. 5 and 6 is obtained.

According to this embodiment, since the signal to the multichannel magnetic transducer head element 1 or the signal from the multichannel magnetic transducer head element 1 is converted in the manner of serial-to-parallel or parallel-to-serial form by the integrated circuit element 22 which is provided with the recording circuit or the reproducing circuit, the number of the lead wires 17 led out from the magnetic transducer head assembly to the outside can be reduced minimum. The number of the lead wires 17 is reduced minimum so that when the magnetic transducer head assembly is assembled into a tape recorder or the like, the mounting, the adjustment and so on can become quite easy. Moreover, since the flexible wiring board for transmitting a large number of signals and so on are not wired, a noise can be reduced. Furthermore, when the multichannel magnetic transducer head element 1 is mounted on the magnetic head mounting portion 15 of the support member 20 merely, the positioning of the multichannel magnetic transducer head element 1 can be carried out surely with ease. In addition, since in the above embodiment the lead frame R and the heat radiating plate 18 are formed integral by the resin mold, there is an advantage that the heat radiating characteristics can be improved.

Figure 7:
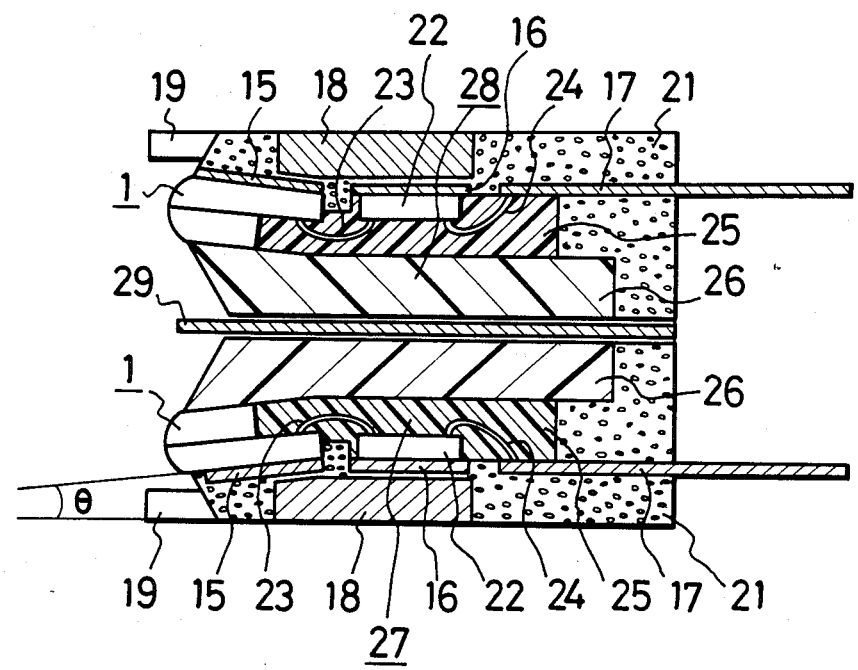
FIG. 7 is a cross-sectional view illustrating another embodiment of the present invention.

FIG. 7 shows such a case in which the magnetic transducer head assembly according to the present invention is provided separately as a recording magnetic transducer head assembly 27 and a playback magnetic transducer head assembly 28 and in which they are formed integral.

In the magnetic transducer head assemblies 27 and 28 shown in FIG. 7, the magnetic head mounting portions 15 are inclined by a predetermined angle $\theta$ and the multichannel magnetic transducer head elements 1 are fixed with a predetermined gap or spacing therebetween. At that time, if the shield covers 26 are removed from the respective magnetic transducer head assemblies 27 and 28, it is possible to further reduce the above gap or spacing therebetween. When the magnetic transducer head assemblies 27 and 28 are formed integral, as shown in FIG. 7, between these magnetic transducer head assemblies 27 and 28 is provided a shield plate 29 made of a magnetic material such as Fe-Ni alloy, sendust alloy, amorphous magnetic material and the like or metal having excellent conductivity such as Cu, Al, Au, Ag and so on by which the influence between the recording and playback magnetic transducer head assemblies 27 and 28 is removed. Further, it is needless to say that the whole area of the outer surfaces of the respective integrated circuit elements 22 in the magnetic transducer head assemblies 27 and 28 except the electrode leading out portions thereof can be coated with a magnetic film (made of Fe-Al alloy, sendust alloy, amorphous magnetic film) having shielding effect or a metal film (made of Cu, Al, Au, Ag and so on) having excellent conductivity.

While in the afore-mentioned embodiments the multichannel thin film magnetic transducer head element is used as the multichannel magnetic transducer head element 1, it is needless to say that instead of the multichannel thin film magnetic transducer head element, a multichannel magneto-resistance effect type magnetic transducer head element can be employed.

As set forth above, according to the present invention, since the terminals of the multichannel magnetic transducer head element 1 are connected to the predetermined terminals of the integrated circuit element 22 which is formed together with the multichannel magnetic transducer head element 1, it is possible to decrease the number of the lead wires led out from the magnetic transducer head assembly. Thus, the magnetic transducer head assembly can be assembled into the tape recorder with ease and also the adjustment and so on thereof can be carried out with ease.

Furthermore, according to the present invention, since the multichannel magnetic transducer head element 1 and the integrated circuit element 22 wherein the recording circuit and the reproducing circuit are provided are formed together, a large number of signal transmission lines is not necessary. There is then an advantage that a noise can be reduced.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. A magnetic transducer head assembly comprising:
a unitary support member comprising a lead frame and a resin molding, said lead frame having a body including a magnetic transducer head mounting portion, an integrated circuit element mounting portion, and a plurality of lead terminals, and said resin molding surrounding said lead frame but leaving exposed said magnetic transducer head mounting portion, said integrated circuit element mounting portion and one end portion of each of the lead terminals;
a multi-channel magnetic transducer head mounted on said magnetic transducer head mounting portions;
an integrated circuit element mounted on said integrated circuit element mounting portions, said integrated circuit element having a reproducing or recording circuit for said magnetic transducer head element; and
wiring means forming pre-determined electrical connections between said transducer head and said integrated circuit element and between said integrated circuit element and said lead terminals; and
a second resin molding encapsulating said magnetic transducer mounting portion and said integrated circuit mounting portion exposing a surface of said magnetic transducer head facing toward a traveling magnetic recording medium.

2. A magnetic transducer head assembly according to claim 1, wherein said reproducing or recording circuit includes a serial-to-parallel converter or parallel-to-serial converter.

3. A magnetic transducer head assembly according to claim 1, wherein said magnetic transducer head element is a thin film magnetic head.

4. A magnetic transducer head assembly according to claim 1, wherein said magnetic transducer head element is a thin film magnetic head utilizing magneto-resistance effect.

5. A magnetic transducer head assembly according to claim 1, wherein said resin mold includes a heat radiating member adjoining said integrated circuit element mounting portion.

6. A magnetic transducer head assembly according to claim 1, wherein said resin mold molding includes a wall which determines the mounting position of said magnetic transducer head element.

7. A magnetic transducer head assembly according to claim 1, wherein the lead terminals of said magnetic transducer head element and said integrated circuit element are connected together by wire bonding.

* * * * *